US009595507B2

(12) United States Patent
Kurita

(10) Patent No.: US 9,595,507 B2
(45) Date of Patent: Mar. 14, 2017

(54) SEMICONDUCTOR DEVICE AND METHOD OF MANUFACTURING THE SAME

(71) Applicant: KABUSHIKI KAISHA TOSHIBA, Minato-ku, Tokyo (JP)

(72) Inventor: Yoichiro Kurita, Tokyo (JP)

(73) Assignee: KABUSHIKI KAISHA TOSHIBA, Tokyo (JP)

(*) Notice: Subject to any disclaimer, the term of this patent is extended or adjusted under 35 U.S.C. 154(b) by 0 days.

(21) Appl. No.: 14/839,676

(22) Filed: Aug. 28, 2015

(65) Prior Publication Data

US 2016/0268232 A1 Sep. 15, 2016

(30) Foreign Application Priority Data

Mar. 11, 2015 (JP) ................. 2015-048491

(51) Int. Cl.
*H01L 25/065* (2006.01)
*H01L 25/00* (2006.01)
(Continued)

(52) U.S. Cl.
CPC ...... *H01L 25/0657* (2013.01); *H01L 21/4853* (2013.01); *H01L 21/56* (2013.01); *H01L 21/561* (2013.01); *H01L 23/3157* (2013.01); *H01L 23/49811* (2013.01); *H01L 23/49816* (2013.01); *H01L 23/49827* (2013.01); *H01L 23/49838* (2013.01); *H01L 23/49894* (2013.01); *H01L 23/562* (2013.01); *H01L 24/97* (2013.01); *H01L 25/50* (2013.01); *H01L 23/3135* (2013.01); *H01L 24/13* (2013.01); *H01L 24/16* (2013.01); *H01L 24/32* (2013.01); *H01L 24/73* (2013.01);
(Continued)

(58) Field of Classification Search
CPC ............. H01L 25/0657; H01L 21/4853; H01L 21/4857; H01L 21/56; H01L 23/3157; H01L 23/49811; H01L 23/49827; H01L 23/49822; H01L 23/49833; H01L 23/4985; H01L 23/49861; H01L 23/49838; H01L 23/49894; H01L 25/50; H01L 2225/06544
USPC ........................................................ 257/774
See application file for complete search history.

(56) References Cited

U.S. PATENT DOCUMENTS

2007/0246833 A1* 10/2007 Soga ................. H01L 23/24
257/772
2007/0278700 A1* 12/2007 St. Germain ....... H01L 23/3107
257/782
(Continued)

FOREIGN PATENT DOCUMENTS

JP 2011187574 A 9/2011
JP 2012146853 A 8/2012
(Continued)

*Primary Examiner* — Yasser A Abdelaziez
(74) *Attorney, Agent, or Firm* — Holtz, Holtz & Volek PC

(57) ABSTRACT

According to one embodiment, a semiconductor device includes a laminate including a plurality of semiconductor chips and having a first width, at least part of the semiconductor chips including an electrode extending through the semiconductor chip, the semiconductor chips being stacked and connected to each other via the electrode; a silicon substrate provided on a first surface of the laminate and having a second width larger than the first width; a wiring layer provided on a second surface of the laminate; and a resin provided around the laminate.

7 Claims, 18 Drawing Sheets

(51) Int. Cl.
  *H01L 23/498* (2006.01)
  *H01L 23/31* (2006.01)
  *H01L 21/48* (2006.01)
  *H01L 21/56* (2006.01)
  *H01L 23/00* (2006.01)
  H01L 25/18 (2006.01)

(52) U.S. Cl.
  CPC .............. *H01L 24/92* (2013.01); *H01L 25/18* (2013.01); *H01L 2224/0401* (2013.01); *H01L 2224/131* (2013.01); *H01L 2224/13025* (2013.01); *H01L 2224/13144* (2013.01); *H01L 2224/16145* (2013.01); *H01L 2224/16146* (2013.01); *H01L 2224/16227* (2013.01); *H01L 2224/1703* (2013.01); *H01L 2224/17181* (2013.01); *H01L 2224/2919* (2013.01); *H01L 2224/32145* (2013.01); *H01L 2224/32225* (2013.01); *H01L 2224/73203* (2013.01); *H01L 2224/73204* (2013.01); *H01L 2224/73253* (2013.01); *H01L 2224/81065* (2013.01); *H01L 2224/81815* (2013.01); *H01L 2224/83005* (2013.01); *H01L 2224/92125* (2013.01); *H01L 2224/92225* (2013.01); *H01L 2224/97* (2013.01); *H01L 2225/06513* (2013.01); *H01L 2225/06517* (2013.01); *H01L 2225/06541* (2013.01); *H01L 2924/10253* (2013.01); *H01L 2924/1434* (2013.01); *H01L 2924/1436* (2013.01); *H01L 2924/1438* (2013.01); *H01L 2924/15311* (2013.01); *H01L 2924/15313* (2013.01); *H01L 2924/18161* (2013.01); *H01L 2924/3511* (2013.01)

(56) References Cited

U.S. PATENT DOCUMENTS

| | | |
|---|---|---|
| 2008/0211043 A1 | 9/2008 | Chen |
| 2008/0296751 A1* | 12/2008 | Fan .................. H01L 23/13 |
| | | 257/693 |
| 2011/0204488 A1 | 8/2011 | Itou et al. |
| 2012/0133051 A1* | 5/2012 | Knickerbocker ..... H01L 23/473 |
| | | 257/774 |
| 2012/0136596 A1 | 5/2012 | Yamaoka et al. |
| 2013/0292842 A1 | 11/2013 | Kim |
| 2014/0284817 A1 | 9/2014 | Sato et al. |

FOREIGN PATENT DOCUMENTS

| | | |
|---|---|---|
| JP | 2014154697 A | 8/2014 |
| TW | 200843098 A | 11/2008 |
| TW | 201029122 A | 8/2010 |
| TW | 201318132 A | 5/2013 |

* cited by examiner

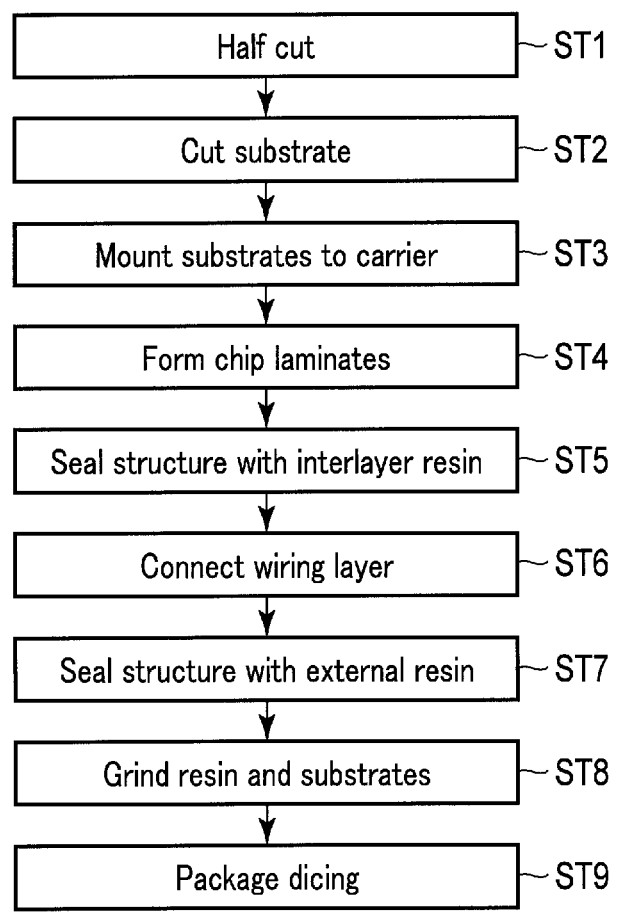
F I G. 2

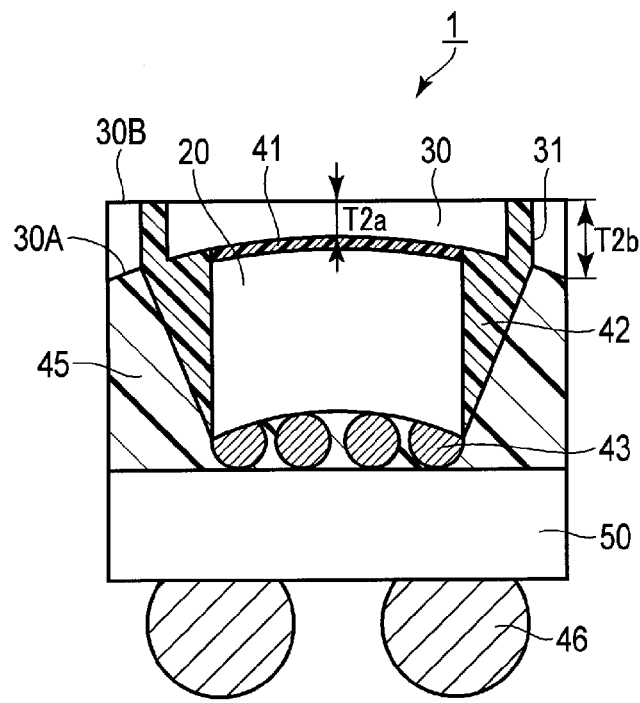
F I G. 11
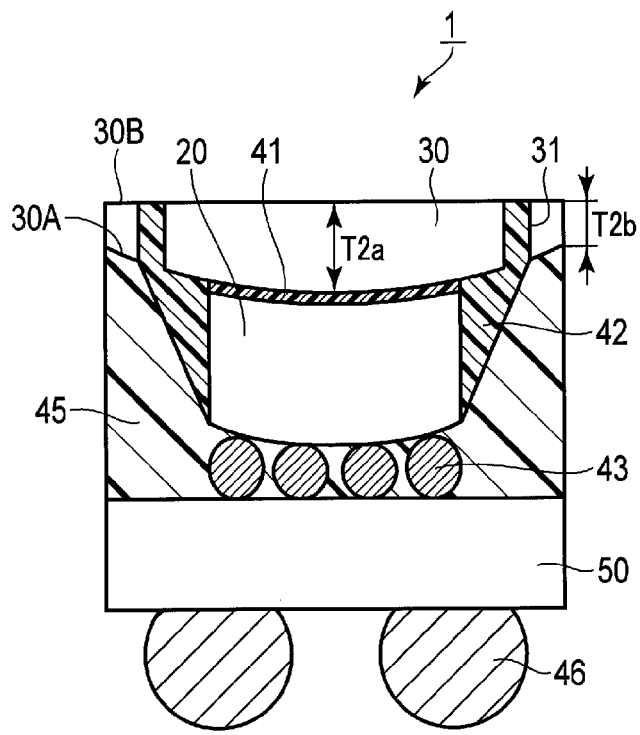
F I G. 12

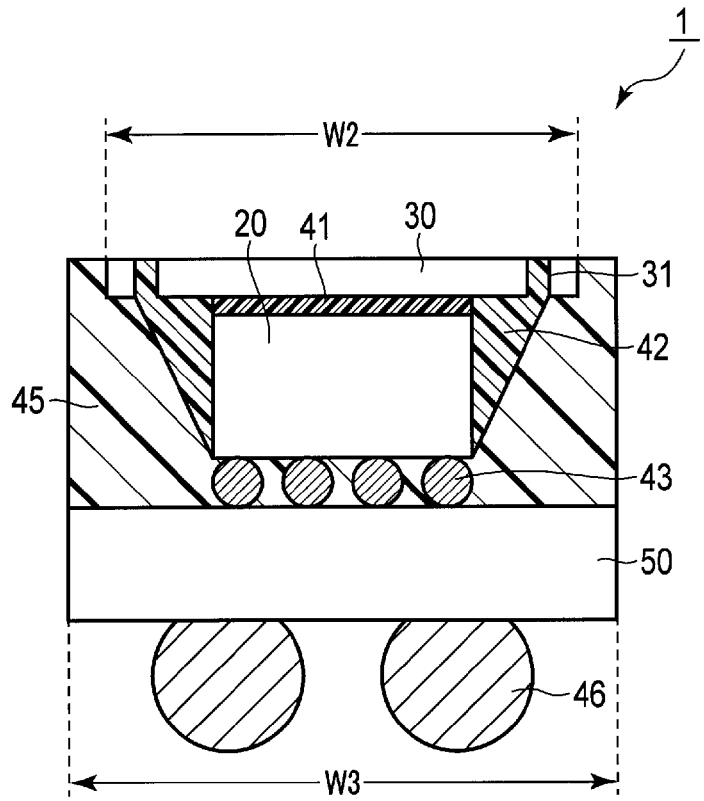
F I G. 22
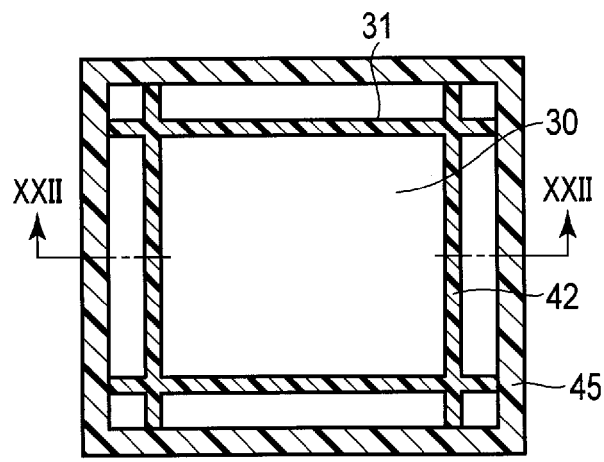
F I G. 23

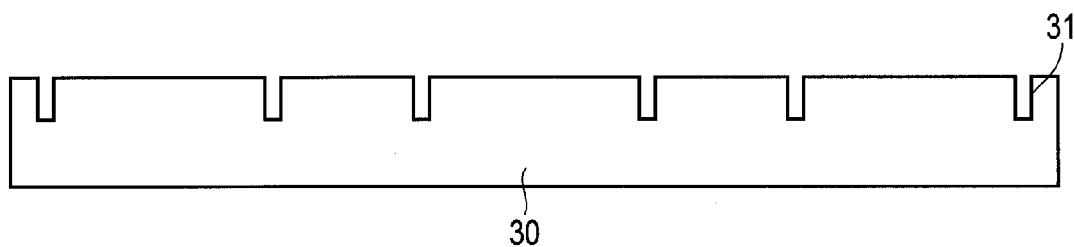
F I G. 27
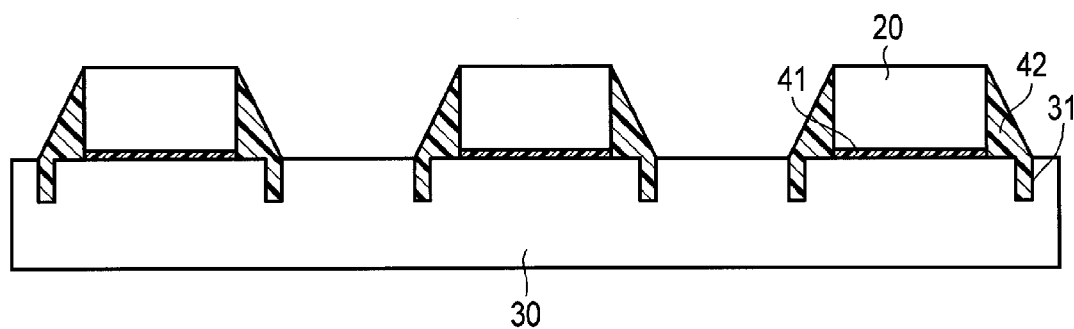
F I G. 28
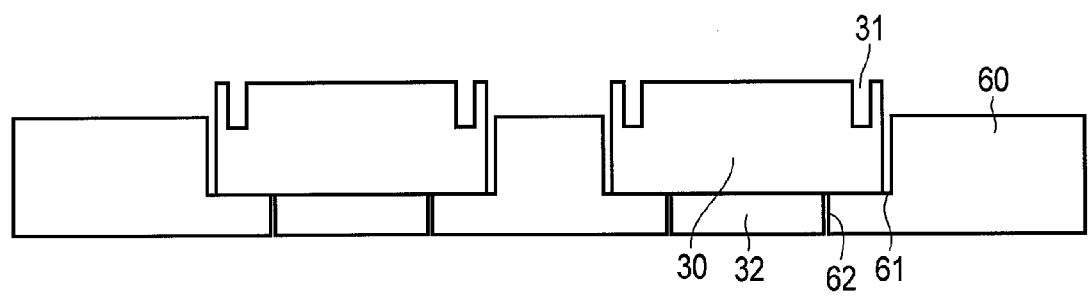
F I G. 29

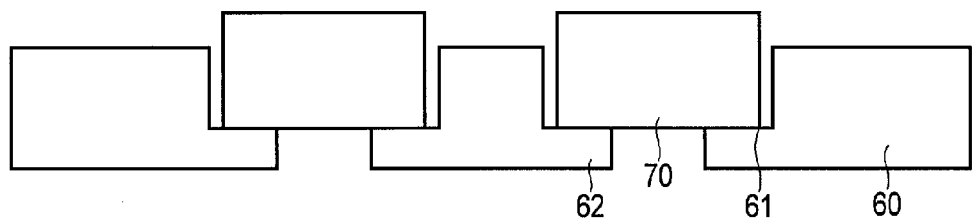
F I G. 32
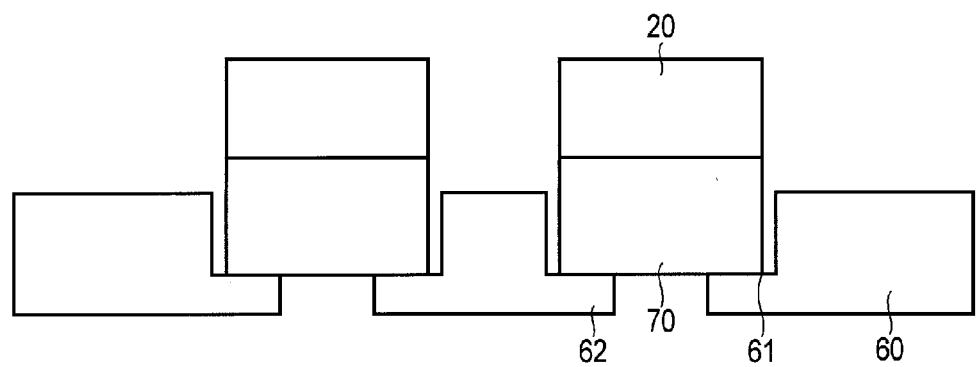
F I G. 33
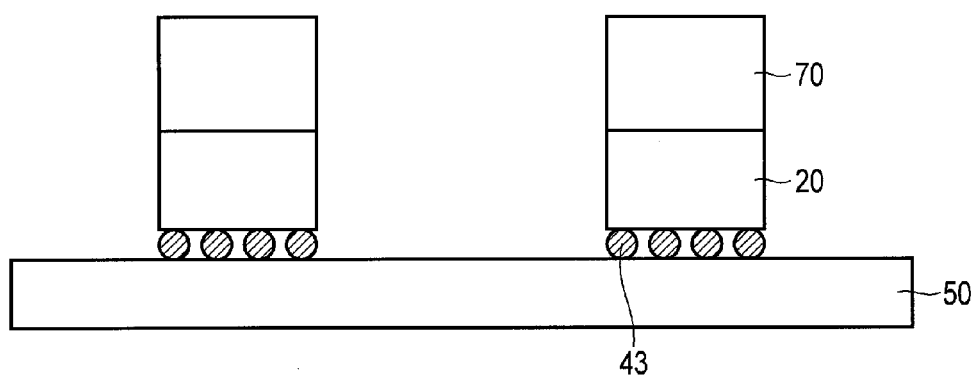
F I G. 34

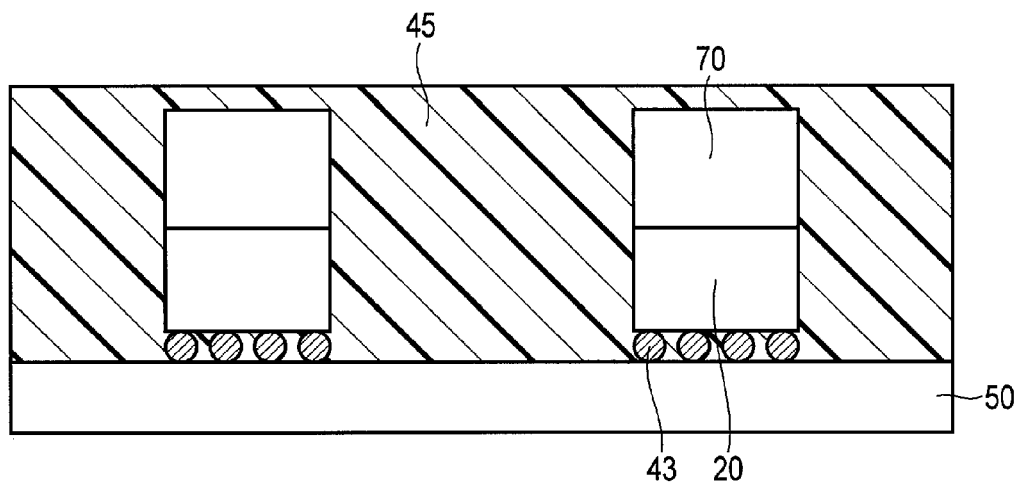
F I G. 35
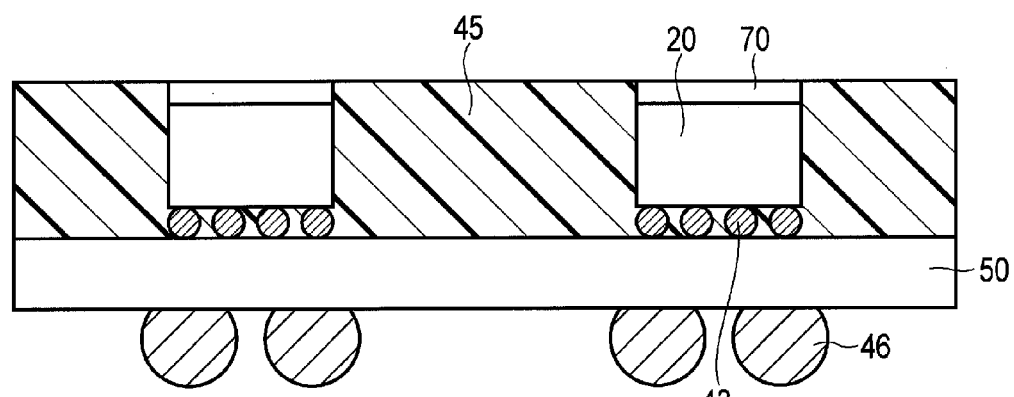
F I G. 36
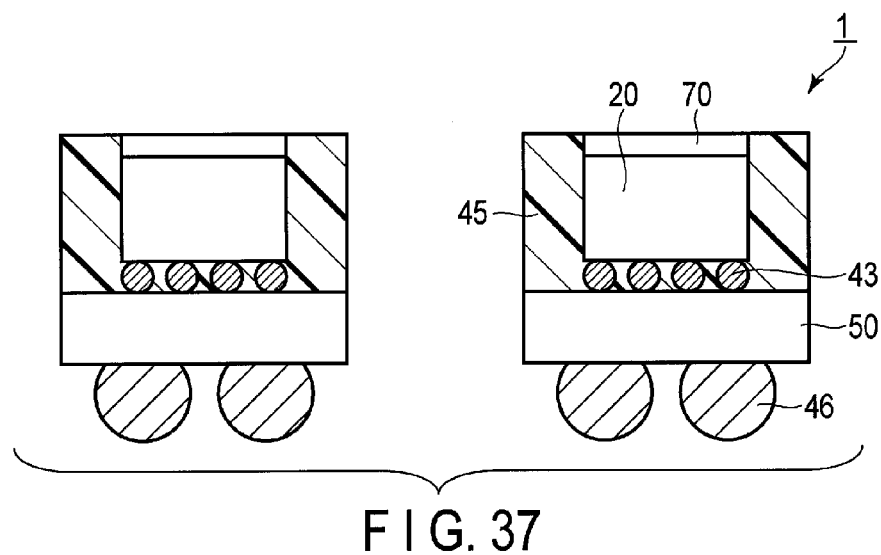
F I G. 37

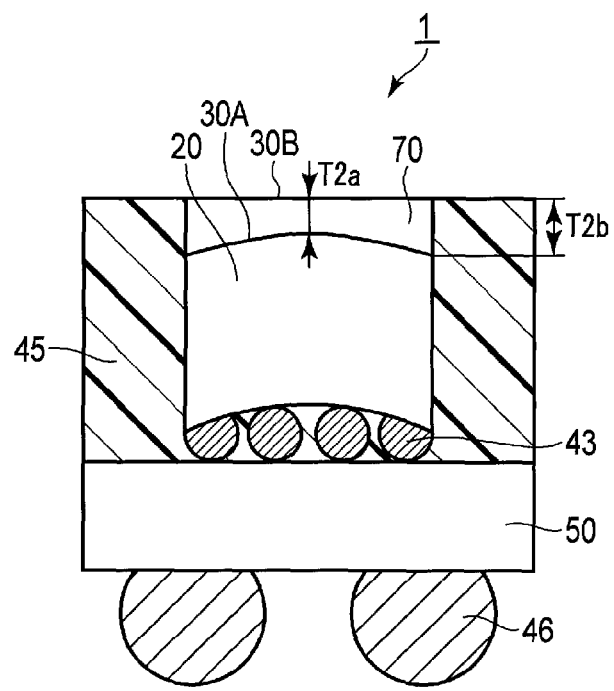
F I G. 38
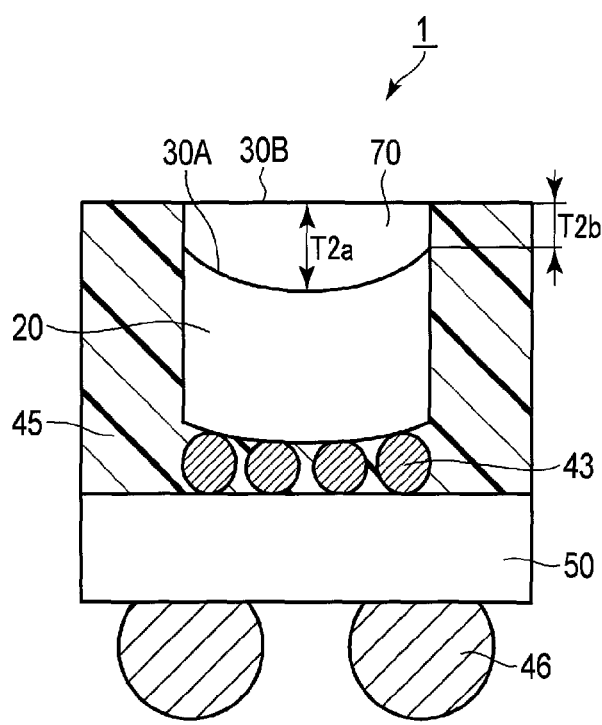
F I G. 39

SEMICONDUCTOR DEVICE AND METHOD OF MANUFACTURING THE SAME

CROSS-REFERENCE TO RELATED APPLICATIONS

This application is based upon and claims the benefit of priority from Japanese Patent Application No. 2015-048491, filed Mar. 11, 2015, the entire contents of which are incorporated herein by reference.

FIELD

Embodiments described herein relate generally to a semiconductor device including a chip laminate in which a plurality of semiconductor chips are stacked, and a method of manufacturing the same.

BACKGROUND

To achieve miniaturization and increase in density of semiconductor devices, semiconductor devices have been proposed in which a plurality of semiconductor chips are stacked on a wiring board to make a package.

However, thinning semiconductor chips reduces semiconductor chip rigidity, and easily causes warping of the semiconductor chips. As a result, a connection failure between the semiconductor chips occurs and reliability of the semiconductor device reduces. Such warping of semiconductor chips increases in the case of stacking semiconductor chips. In addition, warping of semiconductor chips markedly occurs in a structure in which semiconductor chips are connected through silicon vias (TSV) that perpendicularly run through the insides of the semiconductor chips.

BRIEF DESCRIPTION OF THE DRAWINGS

FIG. 2 is a flow chart of a method of manufacturing the semiconductor device according to the first embodiment;

FIG. 11 is a cross-sectional view of a semiconductor device according to a second embodiment;

FIG. 12 is a cross-sectional view of the semiconductor device according to the second embodiment;

FIG. 22 is a cross-sectional view illustrating a substrate of a semiconductor device according to a sixth embodiment;

FIG. 23 is a plan view illustrating the substrate of the semiconductor device illustrated in FIG. 22;

FIG. 27 is a cross-sectional view illustrating a manufacturing step of the semiconductor device according to the seventh embodiment;

FIG. 28 is a cross-sectional view illustrating a manufacturing step of the semiconductor device according to the seventh embodiment, following FIG. 27;

FIG. 29 is a cross-sectional view illustrating a manufacturing step of a semiconductor device according to an eighth embodiment;

FIG. 32 is a cross-sectional view illustrating a manufacturing step of the semiconductor device according to the tenth embodiment;

FIG. 33 is a cross-sectional view illustrating a manufacturing step of the semiconductor device according to the tenth embodiment, following FIG. 32;

FIG. 34 is a cross-sectional view illustrating a manufacturing step of the semiconductor device according to the tenth embodiment, following FIG. 33;

FIG. 35 is a cross-sectional view illustrating a manufacturing step of the semiconductor device according to the tenth embodiment, following FIG. 34;

FIG. 36 is a cross-sectional view illustrating a manufacturing step of the semiconductor device according to the tenth embodiment, following FIG. 35;

FIG. 37 is a cross-sectional view illustrating a manufacturing step of the semiconductor device according to the tenth embodiment, following FIG. 36;

FIG. 38 is a cross-sectional view illustrating a modification of the semiconductor device according to the tenth embodiment; and FIG. 39 is a cross-sectional view illustrating a modification of the semiconductor device according to the tenth embodiment.

DETAILED DESCRIPTION

Figure 1:
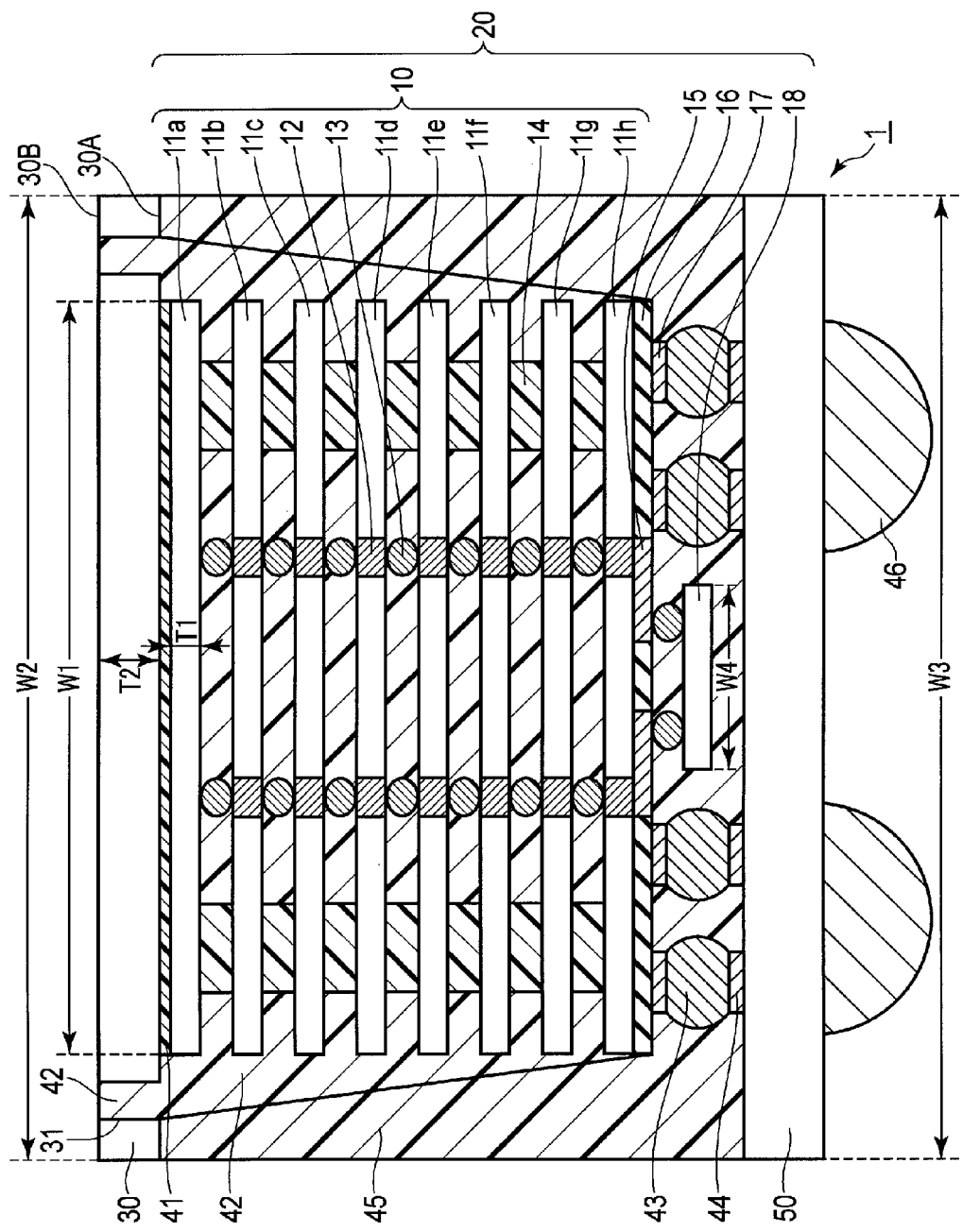
FIG. 1 is a cross-sectional view of a semiconductor device according to a first embodiment.

In general, according to one embodiment, a semiconductor device includes: a laminate including a plurality of semiconductor chips and having a first width, at least part of the semiconductor chips including an electrode extending through the semiconductor chip, the semiconductor chips being stacked and connected to each other via the electrode; a silicon substrate provided on a first surface of the laminate and having a second width larger than the first width; a wiring layer provided on a second surface of the laminate; and a resin provided around the laminate.

Embodiments will be explained hereinafter with reference to drawings. In the following explanation, common reference numerals are assigned to elements having the same function and structure.

[1] First Embodiment

In a semiconductor device according to a first embodiment, warping of semiconductor chips is suppressed by using a silicon substrate as a support member of a chip laminate.

[1-1] Structure

The structure of a semiconductor device 1 according to the first embodiment will be explained hereinafter with reference to FIG. 1.

As illustrated in FIG. 1, the semiconductor device 1 according to the first embodiment includes a chip laminate 20, a substrate 30, a wiring layer 50, and resins 42 and 45. The chip laminate 20 includes a memory chip laminate 10 and an interface chip (IF chip) 18.

The memory chip laminate 10 is formed of a stack of a plurality of semiconductor chips 11a to 11h. Each of the semiconductor chips 11b to 11h has through silicon vias (TSV) 12 that perpendicularly run through the inside of each of the semiconductor chips 11b to 11h and are formed of, for example, silicon (Si). Although FIG. 1 illustrates the semiconductor chip 11a that is located at a lowest layer on the substrate 30 side in the memory chip laminate 10 and does not include through silicon via 12, the semiconductor chip 11a may include through silicon vias 12. The semiconductor chips 11a to 11h are connected to each other with the through silicon vias 12 and bump electrodes 13. Adhesives 14 are provided in regions where no through silicon vias 12 or bump electrodes 13 are formed between the semiconductor chips 11a to 11h, and adhere and fix the semiconductor chips 11a to 11h. Each of the semiconductor chips 11a to 11h is, for example, a memory chip including a NAND flash memory.

The IF chip 18 includes an interface circuit (IF circuit) to perform data communications between the semiconductor chips 11a to 11h forming the memory chip laminate 10 and an external device (not illustrated). The IF chip 18 is connected to the semiconductor chips 11a to 11h via wires 15 and the like. The IF chip 18 is disposed on the uppermost surface on the wiring layer 50 side of the chip laminate 20. However, the position of the IF chip 18 is not limited to the position illustrated in FIG. 1, but may be disposed, for example, between the semiconductor chips 11a to 11h of the memory chip laminate 10. As another example, the IF chip 18 itself may not be provided, but the IF circuit may be mounted to the inside of the semiconductor chips 11a to 11h.

The IF chip 18 has a width W4 that is smaller than a width W1 of the semiconductor chips 11a to 11h (memory chip laminate 10).

The substrate 30 functions as a support member of the chip laminate 20. The substrate 30 is provided onto a first surface of the chip laminate 20 via an adhesive 41. The substrate 30 has a width W2 that is larger than the width W1 of the semiconductor chips 11a to 11h (memory chip laminate 10), and equal to a width W3 of the wiring layer 50. The substrate 30 desirably has a thickness T2 that is equal to or larger than a thickness T1 of each of the semiconductor chips 11a to 11h. The thickness T2 of the substrate 30 may be smaller than the thickness of the wiring layer 50. The thickness T2 of the substrate 30 is, for example, about 100 µm to 200 µm. When the semiconductor chips 11a to 11h have different thicknesses T1 each other, the thickness T2 of the substrate 30 is desirably equal to or larger than the thickness T1 of the thickest semiconductor chip.

The material of the substrate 30 is desirably a material that satisfies: (a) having a thermal expansion coefficient close to a thermal expansion coefficient of the material (mainly silicon) forming the chip laminate 20; (b) high rigidity; and (c) easy cutting and grinding. The material that satisfies the condition (a) enables suppression of warping of the chip laminate 20 even through thermal treatment in the manufacturing process of the semiconductor 1. The material that satisfies the condition (b) enables suppression of warping of the chip laminate 20. The material that satisfies the condition (c) enables easy cutting in a dicing step in packaging and easy grinding in a step of thinning the substrate. Silicon is desirable as a material that satisfies the conditions (a) to (c) as described above. For this reason, it is desired to use a silicon substrate as the substrate 30.

The substrate 30 includes cut portions 31. The cut portions 31 are located outside the region where the chip laminate 20 is disposed. The cut portions 31 extend from a surface 30A of the substrate 30 facing the chip laminate 20 to a surface 30B opposite to the surface 30A.

The wiring layer 50 is provided on a second surface of the chip laminate 20. The wiring layer 50 is connected to electrode pads 17 of the chip laminate 20 via internal connection terminals 43 and 44. External connection terminals 46 are provided on a surface of the wiring layer 50 opposite to the chip laminate 20. The external connection terminals 46 are electrically connected to the internal connection terminals 43 and 44 via a wiring net (not illustrated) in the wiring layer 50. When the semiconductor device 1 is used as a BGA (Ball grid Array) package as illustrated in FIG. 1, the external connection terminals 46 are formed of projection terminals including solder balls, solder plating, or Au plating. However, the semiconductor device 1 of the present embodiment is also applicable to other semiconductor packages such as an LGA (Land grid Array) type provided with metal lands as the external connection terminals 46 and a CSP (Chip Size Package).

The wiring layer 50 has a structure in which, for example, a wiring net (not illustrated) is provided on a surface and inside of an insulating resin substrate or an insulating resin layer. Specifically, a printed wiring board (such as a multilayer printed board) using an insulating resin such as a glass-epoxy resin or a BT resin (bismaleimide triazine resin) is used as the wiring layer 50. As described above, a main material that forms the wiring layer 50 is resin, and different from the material (silicon) of the substrate 30. The wiring layer 50 also includes an interposer, a wiring board, a package substrate, and a rewiring layer that is directly formed on the chip laminate 20. IF chip 18 may be connected to the semiconductor chips 11a to 11h via the wiring layer 50. IF chip 18 may be provided on the wiring layer 50.

The resin 42 is provided between the semiconductor chips 11a to 11h and on side surfaces of the memory chip laminate 10. The resin 42 fills the inside of each of the cut portions 31 of the substrate 30. With this structure, the resin 42 is exposed from the surface 30B of the substrate 30 in each of the cut portions 31. The resin 45 covers the resin 42 and is provided between the substrate 30 and the wiring layer 50.

The resins 42 and 45 are, for example, thermosetting resins. Examples of the thermosetting resins are a mixture of a filler such as silica and an epoxy-based resin, an acrylic resin, an amine-based resin, a silicone-based resin, or a polyimide-based resin. For example, materials having different components are used for the resin 42 and the resin 45. The resin 42 is, for example, an epoxy-based resin that is desirably a material including small filler particles and a liquid material that easily infiltrates. The resin 45 is, for example, an epoxy-based resin that is desirably a material including large filler particles and having a thermal expansion coefficient close to that of the material of the chip laminate 20. As described above, the resin 42 and the resin 45 desirably have different components, even when both of them are epoxy-based resins. However, the resin 42 and the resin 45 may be the same material having the same components.

[1-2] Manufacturing Method

A method of manufacturing the semiconductor device 1 according to the first embodiment will be explained hereinafter with reference to FIG. 2 to FIG. 10.

Figure 3:
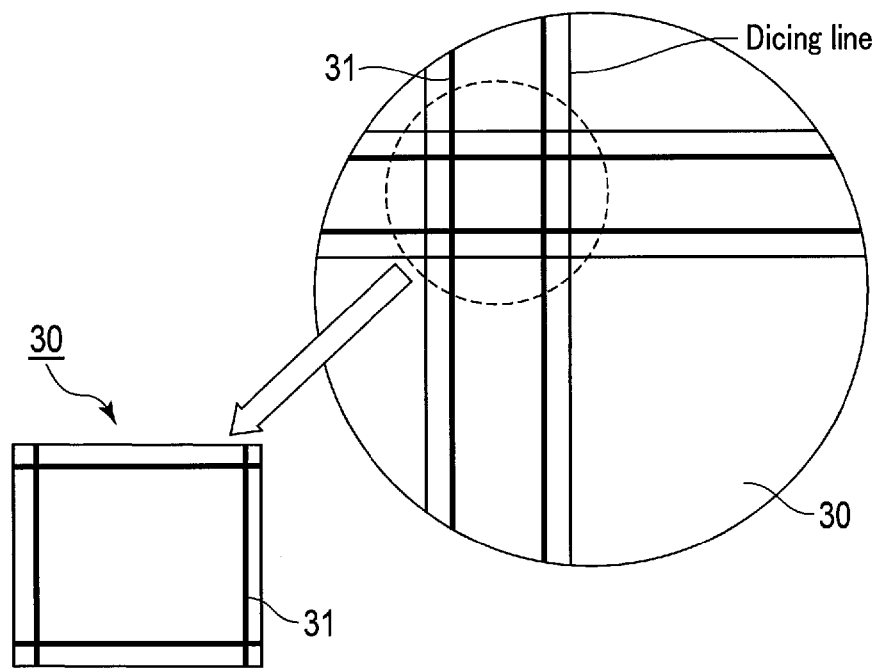
FIG. 3 is a diagram illustrating a manufacturing step of the semiconductor device according to the first embodiment.

First, as illustrated in FIG. 3, for example, an Si substrate 30 is subjected to half cut, to form the cut portions 31 (ST1 of FIG. 2). The cut portions 31 have a predetermined depth that does not penetrate the substrate 30 (see FIG. 5). The depth of the cut portions 31 is, for example, about half the thickness of the substrate 30. Thereafter, the substrate 30 is cut into chips (ST2 of FIG. 2).

Figure 4:
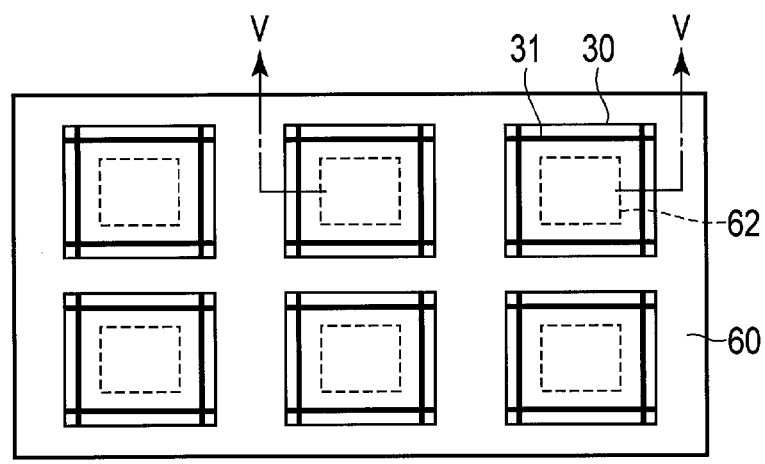
FIG. 4 is a diagram illustrating a manufacturing step of the semiconductor device according to the first embodiment, following FIG. 3.
Figure 5:
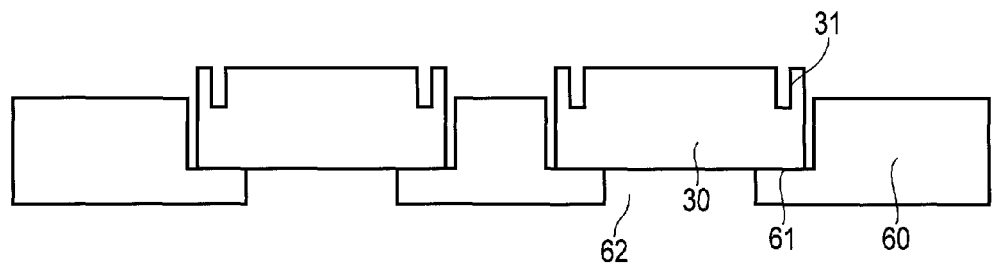
FIG. 5 is a cross-sectional view of substrates and a carrier taken along line V-V of FIG. 4.

Next, as illustrated in FIG. 4 and FIG. 5, substrates 30 are mounted onto a chip carrier 60 (ST3 of FIG. 2). In this step, the substrates 30 are placed on stepped portions 61 of the chip carrier 60 for each chip. Each of the substrates 30 desirably has a thickness equal to or larger than the thickness of the chip laminate 20 described later, for example, about 775 μm. An opening portion 62 is provided at a central part of each stepped portion 61 of the chip carrier 60.

Figure 6:
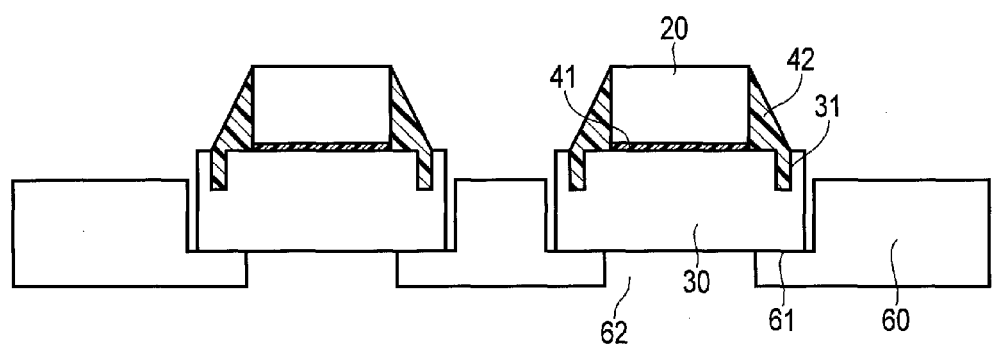
FIG. 6 is a cross-sectional view of a manufacturing step of the semiconductor device according to the first embodiment, following FIG. 5.

Next, as illustrated in FIG. 6, a chip laminate 20 is formed on each substrate 30 via a thermosetting adhesive 41 (ST4 of FIG. 2). Formation of the chip laminate 20 will be explained hereinafter with reference to FIG. 1.

First, a semiconductor chip 11a serving as a first layer of the memory chip laminate 10 is adhered to the substrate 30 at a predetermined position. The predetermined position is, for example, a position within the cut portions 31 of the substrate 30. Thereafter, semiconductor chips 11b to 11h of a predetermined number of layers are successively stacked on the semiconductor chip 11a to form the memory chip laminate 10. In the stacking, the semiconductor chips 11a to 11h are aligned and connected with each other such that the through silicon vias 12 formed of silicon and the bump electrodes 13 are connected. A plurality of adhesives 14 are formed over a surface of each of the semiconductor chips 11a to 11h in regions where no through silicon vias 12 are formed. The adhesives 14 adhere and fix the facing semiconductor chips 11a to 11h when the semiconductor chips 11a to 11h are stacked.

Next, an insulating film 16 is formed on the semiconductor chip 11h located as the uppermost layer of the memory chip laminate 10, and wires 15 that are connected to the through silicon vias 12 are formed in the insulating film 16. Then, an IF chip 18 connected to the wires 15 are mounted. The IF chip 18 is flip-chip connected (FC connected) to the memory chip laminate 10. In this manner, the chip laminate 20 is formed (ST4 of FIG. 2).

Next, as illustrated in FIG. 6, the side surfaces of each chip laminate 20 and spaces between the semiconductor chips 11a to 11h forming each chip laminate 20 are sealed with mold resin 42 (ST5 of FIG. 2). In this step, the resin 42 fills the inside of each of the cut portions 31 of the substrate 30. The cut portions 31 serve as stoppers to prevent the resin 42 from spreading to parts outside the cut portions 31. Sealing with the resin 42 may be properly performed during the steps of forming the chip laminate 20.

Figure 7:
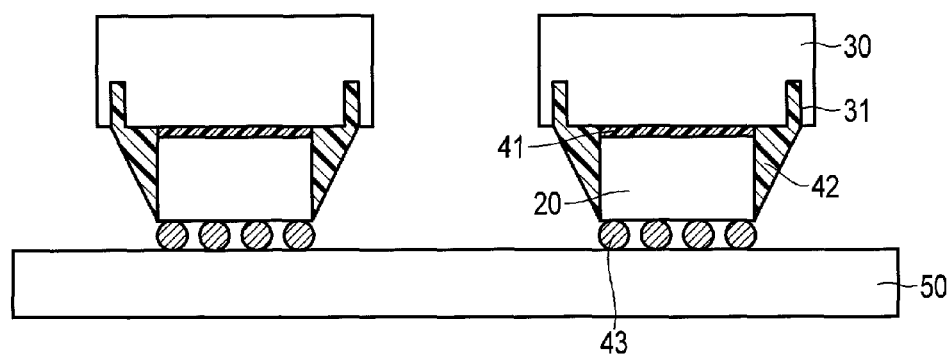
FIG. 7 is a cross-sectional view of a manufacturing step of the semiconductor device according to the first embodiment, following FIG. 6.

Next, as illustrated in FIG. 7, the chip laminate 20 is connected to the wiring layer 50 (ST6 of FIG. 2). Specifically, the IF chip 18 of the chip laminate 20 is disposed to face the wiring layer 50. Then, corresponding internal connection terminals 43 and 44 of the chip laminate 20 and the wiring layer 50 are aligned with each other and temporarily adhered with a temporary fixing material (not illustrated) applied in advance. Thereafter, the chip laminate 20 and the wiring layer 50 are electrically connected by heating (reflow) in a reduction atmosphere such as a formic acid atmosphere.

The reduction atmosphere is used to reduce and remove an oxide film and the like formed on the surfaces of the internal connection terminals 43, to securely achieve electrical connection. The internal connection terminals 43 are mainly formed of, for example, a solder material and/or Au. The internal connection terminals 43 electrically connect the semiconductor chip 11h at the uppermost layer of the memory chip laminate 10 with the wiring layer 50.

Although the above explanation illustrates a connection method using reflow in a reduction atmosphere, a general flip-chip connection method may be used with reduction of the internal connection terminals 43 using a flux and solder reflow.

Figure 8:
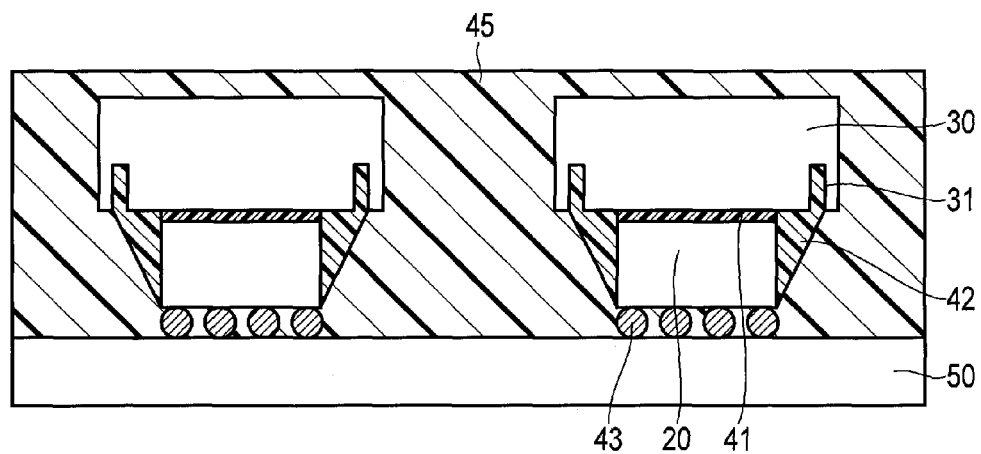
FIG. 8 is a cross-sectional view of a manufacturing step of the semiconductor device according to the first embodiment, following FIG. 7.

Next, as illustrated in FIG. 8, resin 45 fills spaces between the chip laminate 20 and the wiring layer 50 (ST7 of FIG. 2), and each substrate 30 is simultaneously covered with the resin 45. This step may be separated into a step of filling a resin into spaces between the chip laminate 20 and the wiring layer 50, and a step of covering each substrate 30 with the resin. Different resins may be used in the separate steps (not illustrated).

Figure 9:
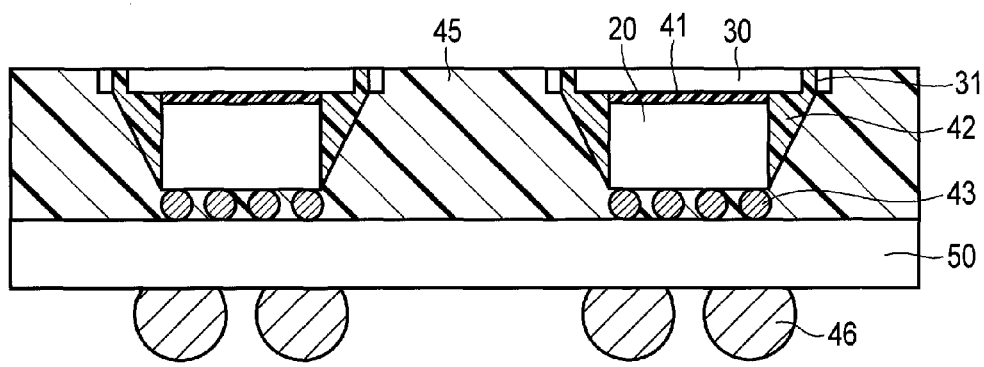
FIG. 9 is a cross-sectional view of a manufacturing step of the semiconductor device according to the first embodiment, following FIG. 8.

Next, as illustrated in FIG. 9, the resin 45 and each substrate 30 are simultaneously ground (ST8 of FIG. 2). In this step, the resin 42 in the cut portions 31 may also be ground and exposed from each substrate 30. Thereafter, external connection terminals 46 are formed on the external surface of the wiring layer 50.

Figure 10:
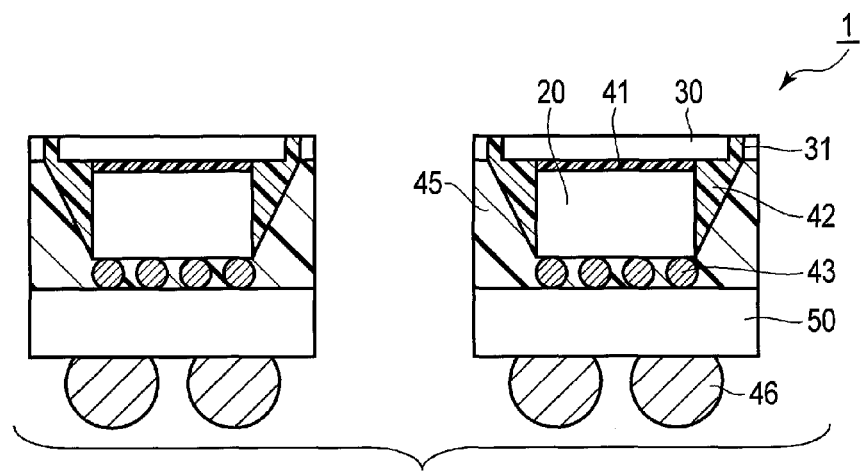
FIG. 10 is a cross-sectional view of a manufacturing step of the semiconductor device according to the first embodiment, following FIG. 9.

Next, as illustrated in FIG. 10, the substrates 30, the wiring layer 50, and the resin 45 are cut by dicing, to perform packaging of each piece (ST9 of FIG. 2). In this manner, the laminated semiconductor device 1 illustrated in FIG. 1 is finished.

[1-3] Effects

According to the first embodiment described above, the silicon substrate 30 is used as the support member of the chip laminate 20. The silicon substrate 30 as described above has the same thermal expansion coefficient as that of the chip laminate 20 including the semiconductor chips 11a to 11h formed of a silicon substrate and the IF chip 18. In addition, silicon has high rigidity and can be easily cut and ground. For this reason, using the silicon substrate 30 serving as the support member enables suppression of warping of the semiconductor chips 11a to 11h, and improvement in reliability of the semiconductor device 1. Further, because the silicon substrate 30 can be easily subjected to grinding and dicing, the package can be easily reduced in size and thickness.

[2] Second Embodiment

In the first embodiment, the substrate 30 serving as the support member of the chip laminate 20 has a fixed thickness T2. By contrast, in the second embodiment, the thickness T2 of the substrate 30 differs between the central portion and the end portions. Differences of the second embodiment from the first embodiment will be explained hereinafter with reference to FIG. 11 and FIG. 12.

As illustrated in FIG. 11 and FIG. 12, a semiconductor device 1 according to the second embodiment has a structure in which a substrate 30 and a chip laminate 20 are warped to have a thickness T2a in the central portion of the substrate 30 and a thickness T2b in end portions of the substrate 30 that are different from each other. However, the warping of the substrate 30 and the chip laminate 20 herein is slight warping that can sufficiently reduce the problems in the conventional art.

In the case illustrated in FIG. 11, the chip laminate 20 is warped to project toward the substrate 30. With this structure, a surface 30A of the substrate 30 has a concave shape that is depressed inside. Specifically, the thickness T2a of the central portion of the substrate 30 is smaller than the thickness T2b of the end portions of the substrate 30.

In the case illustrated in FIG. 12, the chip laminate 20 is warped to project toward the wiring layer 50. With this structure, a surface 30A of the substrate 30 has a convex shape that projects outside. Specifically, the thickness T2a of the central portion of the substrate 30 is larger than the thickness T2b of the end portions of the substrate 30.

In the semiconductor device 1 illustrated in FIG. 11 and FIG. 12, the thickness of the region of the substrate 30 where the chip laminate 20 is formed, that is, the thickness T2a of the central portion of the substrate 30 is desirably equal to or larger than the thickness T1 of each of the semiconductor chips 11a to 11h.

The second embodiment described above enables suppression of warping of the semiconductor chips 11a to 11h in comparison with the conventional art, like the first embodiment, even when the substrate 30 and the chip laminate 20 are slightly warped.

The thickness T2 of the region of the substrate 30 where the chip laminate 20 is formed is desirably equal to or larger than the thickness T1 of each of the semiconductor chips 11a to 11h, even in the case where the substrate 30 and the chip laminate 20 are not warped but the thickness T2 of the substrate 30 varies.

[3] Third Embodiment

A semiconductor 1 according to the third embodiment is a modification of the cut portions 31 of the substrate 30. Differences of the third embodiment from the first embodiment will be explained hereinafter with reference to FIG. 13 to FIG. 16.

Figure 13:
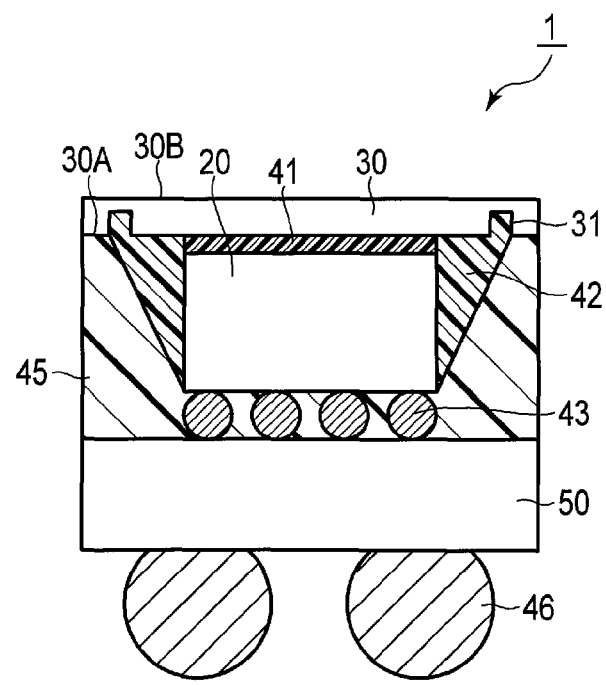
FIG. 13 is a cross-sectional view of a semiconductor device according to a third embodiment.

As illustrated in FIG. 13, the cut portions 31 may have a recessed shape. Specifically, each of the cut portions 31 is a recessed portion that is depressed from the surface 30A facing the chip laminate 20. For this reason, the resin 42 in each of the cut portions 31 is not exposed from the external surface 30B of the substrate 30. The semiconductor device 1 having the structure as illustrated in FIG. 13 has an effect of improving adhesion of the substrate 30 to the resin 42, and increasing the reliability of the package against deforming stress, because the resin 42 enters the recessed portions.

Figure 14:
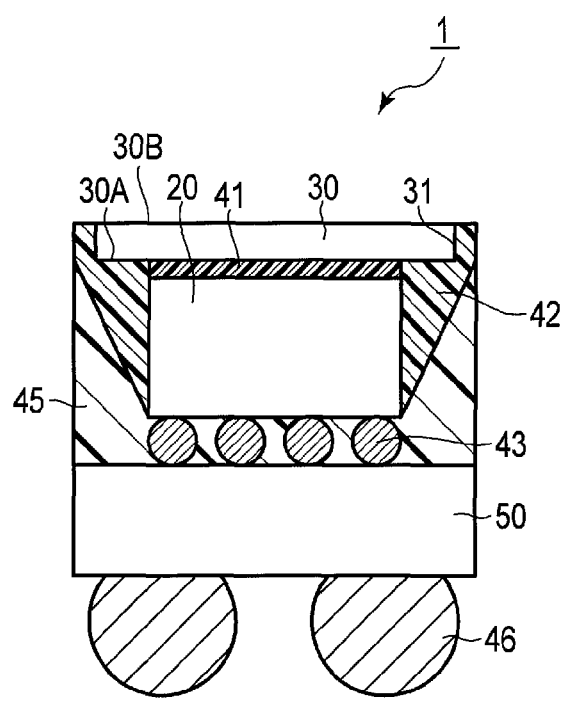
FIG. 14 is a cross-sectional view of the semiconductor device according to the third embodiment.

As illustrated in FIG. 14, dicing may be performed in each of the cut portions 31. Specifically, the resin 42 in the cut portions 31 is exposed from the side surfaces of the substrate 30. In other words, the circumference of the substrate 30 is covered with the resin 42. The semiconductor device 1 having the structure as illustrated in FIG. 14 has an effect of protecting the end portions of the substrate 30 by the resin 42 without being exposed at the end portions of the package, and increasing the reliability of the package with respect to shock resistance.

Figure 15:
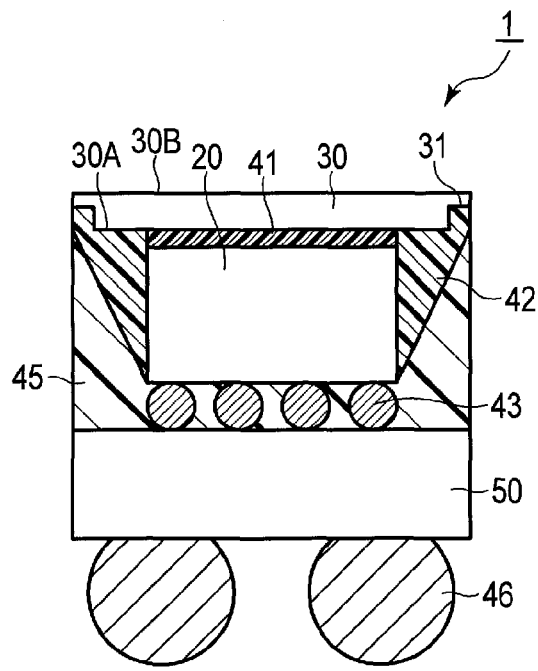
FIG. 15 is a cross-sectional view of the semiconductor device according to the third embodiment.

As illustrated in FIG. 15, dicing may be performed in each of the cut portions 31 having a depressed shape. Specifically, the resin 42 in the cut portions 31 is exposed from side surfaces of the internal portion of the substrate 30. In other words, the resin 42 covers the circumference of the side surfaces of the internal portion of the substrate 30. In addition, the substrate 30 has a projecting shape that projects toward the chip laminate 20. The semiconductor device 1 having the structure illustrated in FIG. 15 has an effect of easing the stress caused by a difference in thermal expansion coefficient between the resin 42 and the substrate 30 by deforming the substrate 30, and increasing the thermal reliability, because the end portions of the substrate 30 are formed thin.

Figure 16:
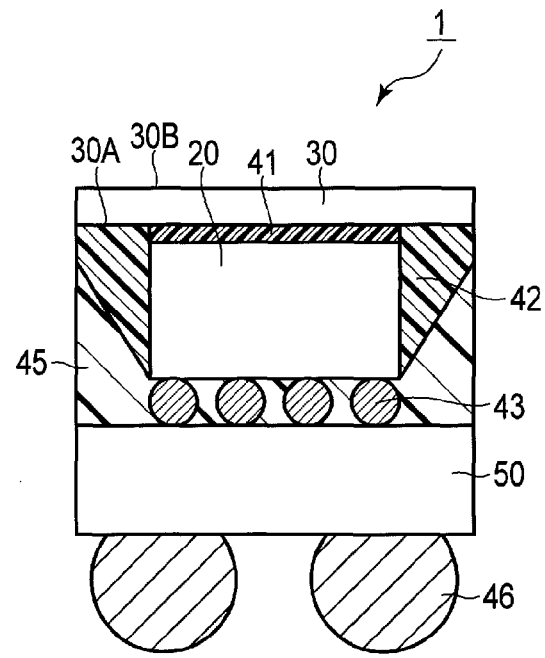
FIG. 16 is a cross-sectional view of the semiconductor device according to the third embodiment.

As illustrated in FIG. 16, dicing may be performed at positions further inner than the cut portions 31, to remove the cut portions 31. The semiconductor device 1 having the structure illustrated in FIG. 16 has an effect of increasing the rigidity of the whole package and increasing the reliability of the package in handling, because the substrate 30 has a relatively large thickness at the end portions of the package.

The semiconductor device 1 according to the third embodiment described above enables suppression of warping of the semiconductor chips 11a to 11h, like the first embodiment.

[4] Fourth Embodiment

A semiconductor 1 according to the fourth embodiment is a modification of the resin in the cut portions 31. Differences of the fourth embodiment from the first embodiment will be explained hereinafter with reference to FIG. 17 and FIG. 18.

Figure 17:
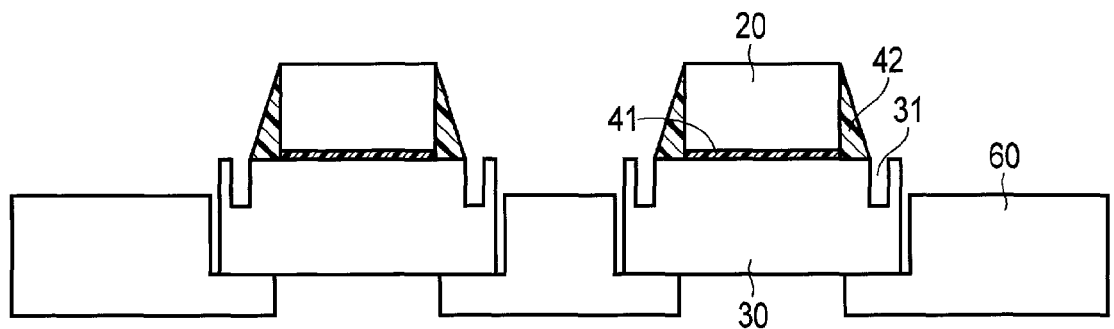
FIG. 17 is a cross-sectional view illustrating a manufacturing step of a semiconductor device according to a fourth embodiment.
Figure 18:
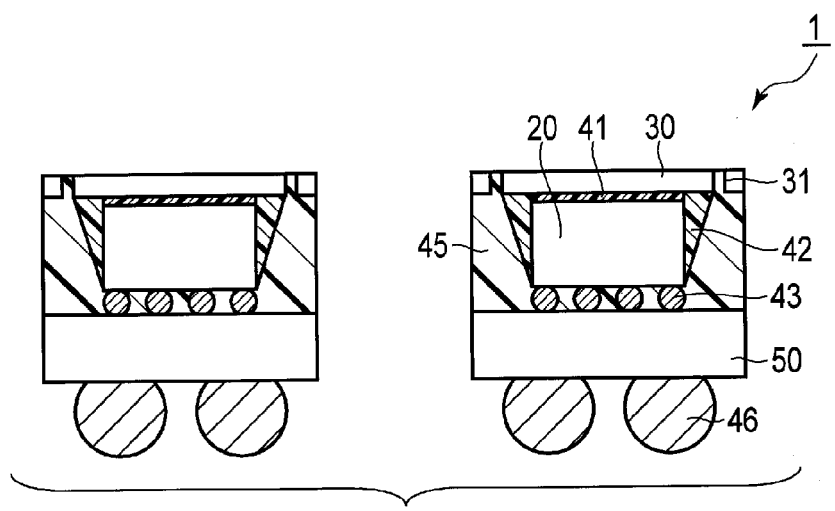
FIG. 18 is a cross-sectional view illustrating the semiconductor device according to the fourth embodiment.

As illustrated in FIG. 17, when the circumference of each chip laminate 20 is sealed with the resin 42, the resin 42 may not enter the cut portions 31. In this case, in the semiconductor device 1 serving as the end structure, the cut portions 31 may be filled with the resin 45, as illustrated in FIG. 18.

The semiconductor device 1 according to the fourth embodiment described above enables suppression of warping of the semiconductor chips 11a to 11h, like the first embodiment.

In addition, the semiconductor device 1 according to the fourth embodiment has an effect of increasing the reliability in comparison with the case where the cut portions 31 are filled with the resin 42, because the cut portions 31 are filled with the resin 45 and consequently shrinkage stress in curing the resin 42 having a relatively large thermal expansion coefficient is not applied to thin portions of the substrate 30.

[5] Fifth Embodiment

In the fifth embodiment, plan views of the substrate 30 in the respective embodiments will be explained with reference to FIG. 19 to FIG. 21.

Figure 19:
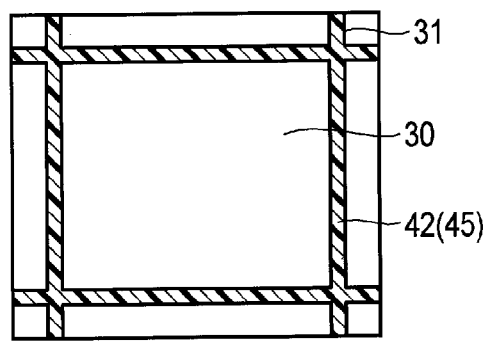
FIG. 19 is a plan view illustrating a substrate of a semiconductor device according to a fifth embodiment.

As illustrated in FIG. 19, cut portions 31 are provided inside the substrate 30, and resin 42 and 45 do not surround the circumference of the side surfaces of the substrate 30. The semiconductor device 1 illustrated with such a plan view has a cross-sectional structure as illustrated in, for example, FIG. 1. The semiconductor device 1 as illustrated in FIG. 19 has an effect of increasing adhesion of the substrate 30 to the resin 42 or resin 45, and increasing the reliability of the package against deforming stress, because the resin 42 or resin 45 enters the cut portions 31.

Figure 20:
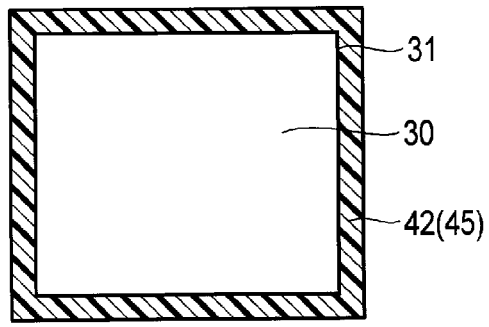
FIG. 20 is a plan view illustrating the substrate of the semiconductor device according to the fifth embodiment.

As illustrated in FIG. 20, resin 42 or 45 is formed around the substrate 30, and all the side surfaces of the substrate 30 are covered with the resin 42 or 45. The semiconductor device 1 illustrated with such a plan view has a cross-sectional structure as illustrated in, for example, FIG. 14. The semiconductor device 1 as illustrated in FIG. 20 has an effect of protecting the end portions of the substrate 30 by the resin 42 or 45 without being exposed at the end portions of the package, and increasing the reliability of the package with respect to shock resistance.

Figure 21:
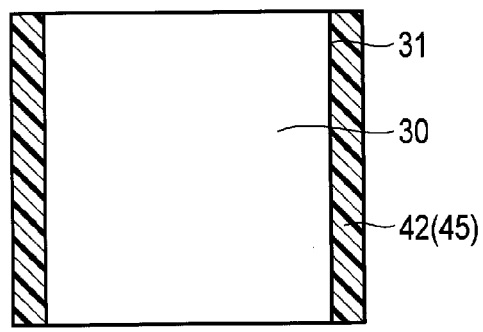
FIG. 21 is a plan view illustrating the substrate of the semiconductor device according to the fifth embodiment.

As illustrated in FIG. 21, part of the side surfaces of the substrate 30 is covered with the resin 42 or 45. The semiconductor device 1 illustrated with such a plan view has a cross-sectional structure as illustrated in, for example, FIG. 14 or FIG. 16. The semiconductor device 1 as illustrated in FIG. 21 has an effect of increasing the reliability of the package with respect to shock resistance, in the end portions of the substrate 30 that are protected by the resin 42 or 45 without being exposed at the end portions of the package.

The semiconductor device 1 according to the fifth embodiment described above enables suppression of warping of the semiconductor chips 11a to 11h, like the first embodiment.

The cut portions 31 of the substrate 30 are not limited to the structure in which one cut portion is formed in one side surface of the substrate 30, and a plurality of cut portions may be provided.

[6] Sixth Embodiment

A semiconductor device 1 according to the sixth embodiment is a modification of the width W2 of the substrate 30. Differences of the sixth embodiment from the first embodiment will be explained hereinafter with reference to FIG. 22 and FIG. 23.

As illustrated in FIG. 22, the width W2 of the substrate 30 may be smaller than the width W3 of the wiring layer 50. In this case, as illustrated in FIG. 23, resin 45 covers the circumference of the side surfaces of the substrate 30.

The semiconductor device 1 according to the sixth embodiment described above enables suppression of warping of the semiconductor chips 11a to 11h, like the first embodiment.

The width W2 of the substrate 30 may be the same as the width W1 of the chip laminate 20.

[7] Seventh Embodiment

In the seventh embodiment, a method of manufacturing the semiconductor device 1 different from the first embodiment will be explained hereinafter with reference to FIG. 24 to FIG. 28. Differences of the seventh embodiment from the first embodiment will be explained hereinafter.

Figure 24:
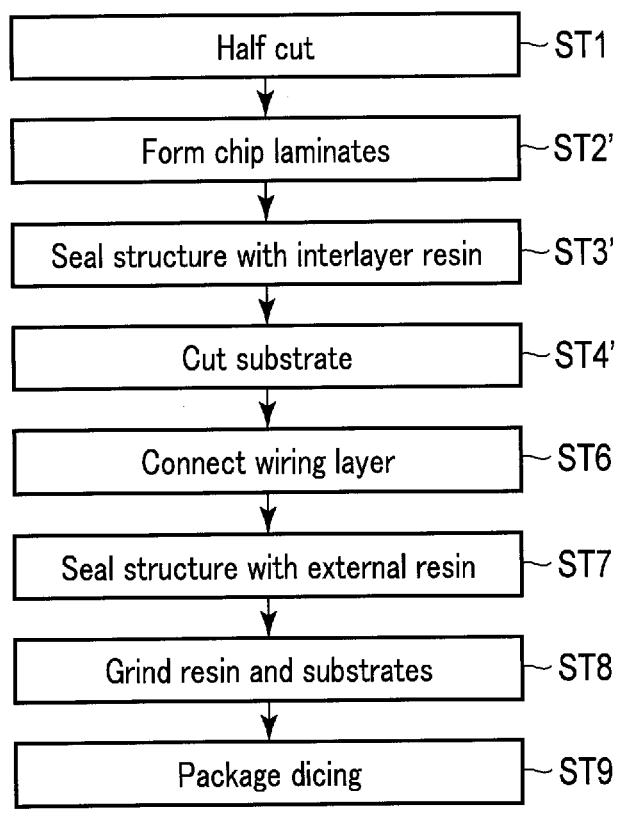
FIG. 24 is a flowchart of a method of manufacturing a semiconductor device according to a seventh embodiment.
Figure 25:
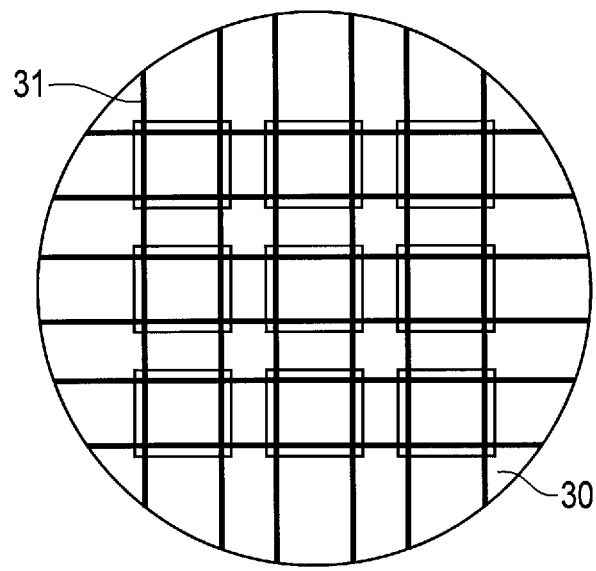
FIG. 25 is a diagram illustrating a manufacturing step of the semiconductor device according to the seventh embodiment.
Figure 26:
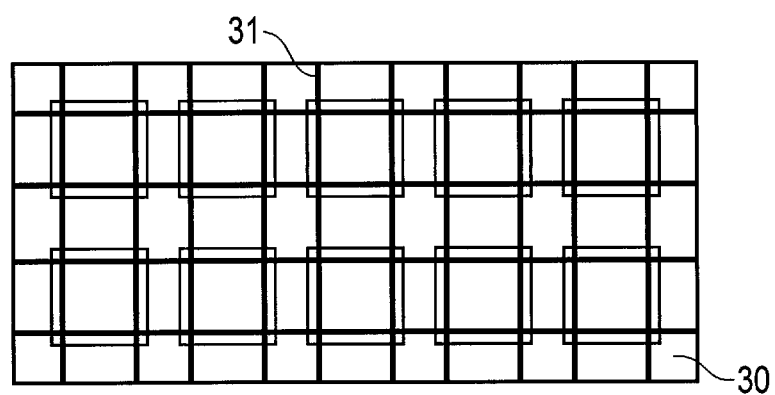
FIG. 26 is a diagram illustrating a manufacturing step of the semiconductor device according to the seventh embodiment.

First, as illustrated in FIG. 25 to FIG. 27, for example, a silicon substrate 30 is subjected to half cut, to form cut portions 31 (ST1 of FIG. 24). The substrate 30 may be a silicon wafer (circular shape) illustrated in FIG. 25, or a silicon long substrate (rectangular shape) illustrated in FIG. 26.

Next, as illustrated in FIG. 28, chip laminates 20 are formed on the substrate 30 via thermosetting adhesives 41 (ST2' of FIG. 24).

Thereafter, an interlayer sealing resin 42 is filled on the side surfaces of each of the chip laminates 20 and into spaces between semiconductor chips 11a to 11h forming each of the chip laminates 20 and the cut portions 31 (ST3' of FIG. 24).

Next, the substrate 30 is cut into chips (ST4' FIG. 24).

Thereafter, steps ST6 to ST9 are performed in the same manner as the first embodiment.

In the first embodiment, the substrate 30 is cut into chips after half cut. By contrast, in the seventh embodiment, the substrate 30 is cut into chips after the side surfaces of the chip laminate 20 are sealed with the resin 42. In addition, no chip carrier 60 is used in the process of manufacturing the semiconductor device 1 according to the seventh embodiment. The semiconductor device 1 according to the seventh embodiment described above also enables suppression of warping of the semiconductor chips 11a to 11h, like the first embodiment.

[8] Eighth Embodiment

A semiconductor device 1 according to the eighth embodiment is a modification of the shape of the substrate 30 before grinding. Differences of the eighth embodiment from the first embodiment will be explained hereinafter with reference to FIG. 29.

As illustrated in FIG. 29, each substrate 30 may include a projection 32 corresponding to an opening portion 62 of the carrier 60. The projection 32 is provided on a surface of the substrate 30 opposite to the surface of the substrate 30 provided with the cut portions 31.

The projection 32 of the substrate 30 is removed in the grinding step of FIG. 9. Therefore, the end semiconductor device 10 according to the eighth embodiment has the same structure as that of FIG. 1. However, the projection 32 of the substrate 30 may be left after the grinding step of FIG. 9.

The semiconductor device 1 according to the eighth embodiment described above enables suppression of warping of the semiconductor chips 11a to 11h, like the first embodiment. In addition, according to the eighth embodiment, the projection 32 of each substrate 30 is fitted into the opening portion 62 of the carrier 60 when the substrate 30 is carried into the chip carrier 60. With this structure, the following process can be stably performed.

[9] Ninth Embodiment

A semiconductor 1 according to the ninth embodiment serves as the case of using DRAMs as the semiconductor chips 11a to 11h. Differences of the ninth embodiment from the first embodiment will be explained hereinafter with reference to FIG. 30.

Figure 30:
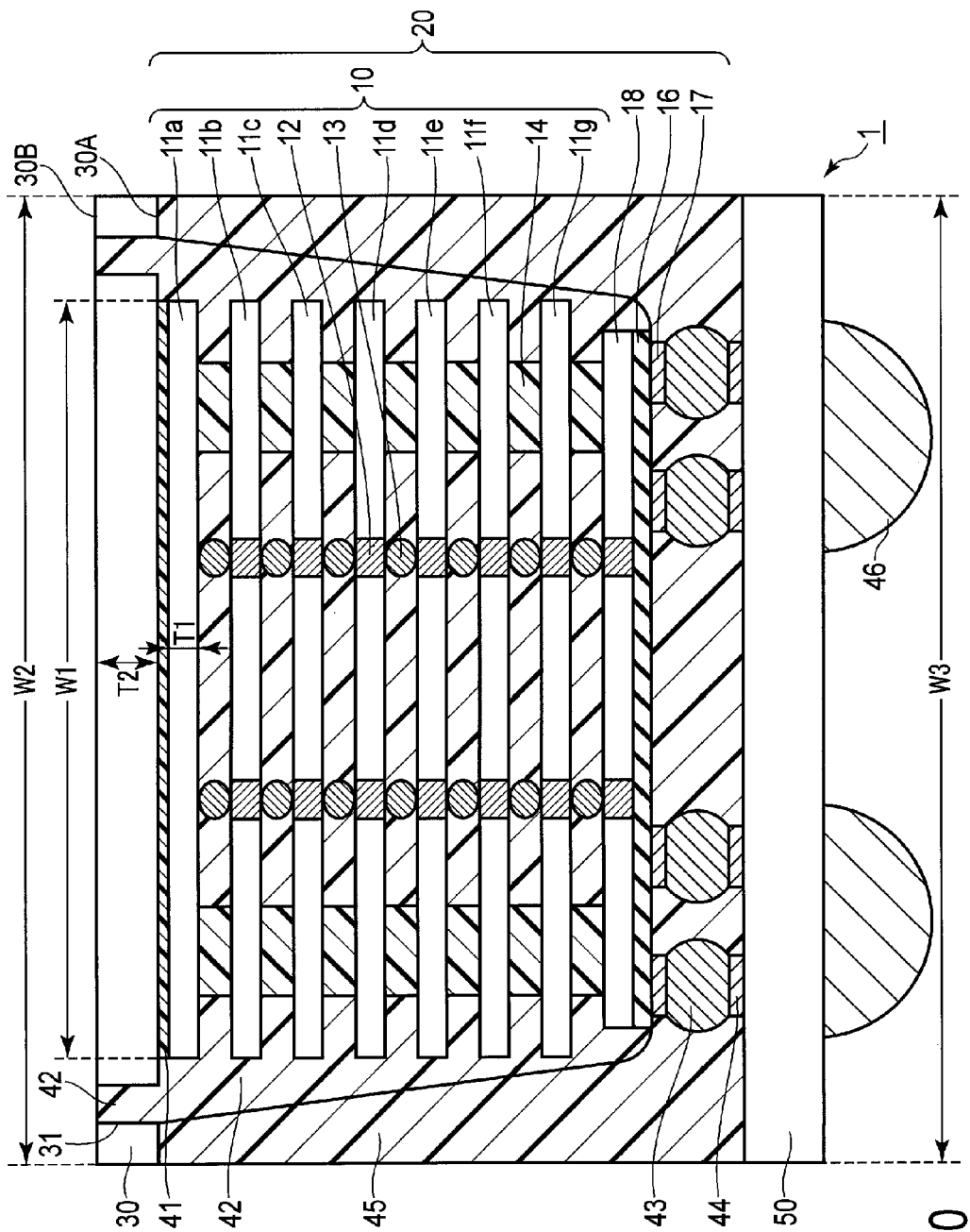
FIG. 30 is a cross-sectional view illustrating a semiconductor device according to a ninth embodiment.

As illustrated in FIG. 30, each of the semiconductor chips 11a to 11h may be, for example, a memory chip including a DRAM. In this case, the chip used as the IF chip 18 is wider than that in the structure of FIG. 1, and connected to the internal connection terminals 43 and 44.

The semiconductor device 1 according to the ninth embodiment described above enables suppression of warping of the semiconductor chips 11a to 11h, like the first embodiment.

[10] Tenth Embodiment

The tenth embodiment is an example of using a semiconductor chip 70 as a substrate 70 serving as a support member of the chip laminate 20. Difference of the tenth embodiment from the first embodiment will be explained hereinafter with reference to FIG. 31.

[10-1] Structure

The structure of a semiconductor device 1 according to the tenth embodiment will be explained hereinafter.

Figure 31:
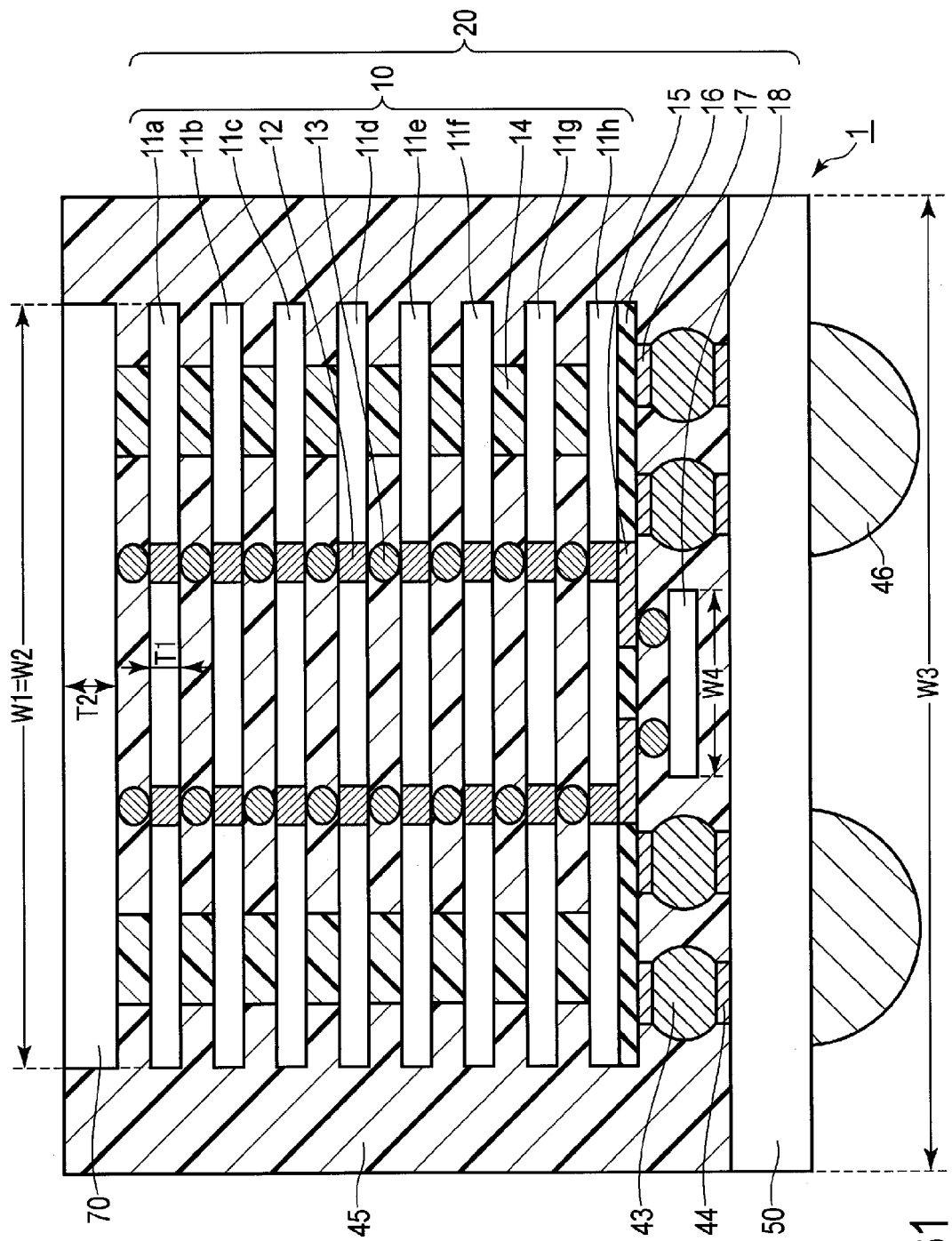
FIG. 31 is a cross-sectional view illustrating a semiconductor device according to a tenth embodiment.

As illustrated in FIG. 31, in the semiconductor device 1 according to the tenth embodiment, a semiconductor integrated circuit is mounted to the substrate 70 serving as the support member of the chip laminate 20. Specifically, the substrate 70 has the same structure as that of the semiconductor chips 11a to 11h forming the chip laminate 20.

Accordingly, the substrate 70 can be regarded as a substrate of the semiconductor chip of the first layer in the chip laminate 20.

The substrate 70 desirably has a thickness T2 equal to or larger than the thickness T1 of each of the semiconductor chips 11a to 11h. For example, the thickness T2 is three to five times as large as the thickness T1 of each of the semiconductor chips 11a to 11h. For example, the thickness T2 of the substrate 70 is about 150 μm, and the thickness T1 of each of the semiconductor chips 11a to 11h is about 30 to 50 μm.

The width W2 of the substrate 70 is equal to the width W1 of the semiconductor chips 11a to 11h (memory chip laminate 10). However, the width W2 of the substrate 70 may be set larger than the width W1 of the semiconductor chips 11a to 11h (memory chip laminate 10). The substrate 70 and the semiconductor chips 11a to 11h (memory chip laminate 10) may have the same size.

The substrate 70 has no through silicon vias 12 provided in each of the semiconductor chips 11a to 11h. Through silicon vias 12 may be formed in the substrate 70.

The resin 45 is provided between the semiconductor chips 11a to 11h, and on side surfaces of the memory chip laminate 10 and the substrate 70.

[10-2] Manufacturing Method

A method of manufacturing the semiconductor device 1 according to the tenth embodiment will be explained hereinafter with reference to FIG. 32 to FIG. 37.

First, as illustrated in FIG. 32, substrates 70 are mounted onto the chip carrier 60. Each of the substrates 70 is a substrate of a semiconductor chip to which a semiconductor integrated circuit is mounted. The substrate 70 desirably has a thickness equal to or larger than the thickness of the chip laminate 20, for example, about 775 μm.

Next, as illustrated in FIG. 33, a chip laminate 20 is formed on each substrate 70. Then, as illustrated in FIG. 34, each chip laminate 20 is connected to a wiring layer 50 via internal connection terminals 43. Next, as illustrated in FIG. 35, the substrates 70, the chip laminates 20, and the wiring layer 50 are sealed with resin 45. In the sealing, the resin 45 may fill spaces between the semiconductor chips 11a to 11h of the chip laminate 20.

Next, as illustrated in FIG. 36, the resin 45 and the substrates 70 are simultaneously ground, to thin the substrates 70. Thereafter, as illustrated in FIG. 37, the substrates 70, the wiring layer 50, and the resin 45 are cut by dicing into separate packages. As described above, the laminated semiconductor device 1 illustrated in FIG. 10 is finished.

The semiconductor device 1 according to the tenth embodiment as described above enables suppression of warping of the semiconductor chips 11a to 11h, like the first embodiment.

The semiconductor device 1 according to the tenth embodiment may have a structure in which the thickness T2a in the central portion of the substrate 70 is different from the thickness T2b in the end portions of the substrate 70, as illustrated in FIG. 38 and FIG. 39, like the second embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
   a laminate including a plurality of semiconductor chips and having a first width, at least part of the semiconductor chips including an electrode extending through the semiconductor chip, the semiconductor chips being stacked and connected to each other via the electrode;
   a silicon substrate provided on a first surface of the laminate and having a second width larger than the first width;
   a wiring layer provided on a second surface of the laminate; and
   a resin provided around the laminate,
   wherein:
   the silicon substrate includes a cut portion,
   the cut portion is positioned outside a region where the laminate is disposed, and
   the resin is provided in the cut portion.

2. The semiconductor device according to claim 1, wherein:
   the cut portion extends through a third surface to a fourth surface of the silicon substrate,
   the third surface faces the first surface of the laminate, and
   the fourth surface is located opposite to the third surface.

3. The semiconductor device according to claim 2, wherein the resin in the cut portion is exposed from the fourth surface of the silicon substrate.

4. The semiconductor device according to claim 1, wherein the cut portion is a recessed portion that is depressed from a surface of the silicon substrate facing the first surface of the laminate.

5. The semiconductor device according to claim 1, wherein the silicon substrate has a thickness equal to or larger than a thickness of one of the semiconductor chips.

6. The semiconductor device according to claim 1, wherein a thickness of a central portion of the silicon substrate is different from a thickness of end portions of the silicon substrate.

7. The semiconductor device according to claim 1, further comprising:
   a first chip provided between the wiring layer and the second surface of the laminate, electrically connected to the laminate, and having a fourth width smaller than the first width.

\* \* \* \* \*